United States Patent [19]

Anglin et al.

[11] Patent Number: 5,767,480
[45] Date of Patent: Jun. 16, 1998

[54] HOLE GENERATION AND LEAD FORMING FOR INTEGRATED CIRCUIT LEAD FRAMES USING LASER MACHINING

[75] Inventors: Noah L. Anglin; Nick Bacile, both of San Jose; Vladimir Perelman, Fremont, all of Calif.

[73] Assignee: National Semiconductor Corporation, Santa Clara, Calif.

[21] Appl. No.: 508,513

[22] Filed: Jul. 28, 1995

[51] Int. Cl.⁶ ................................. B23K 26/00
[52] U.S. Cl. ........................ 219/121.69; 29/827
[58] Field of Search ............... 219/121.7, 121.71, 219/121.67, 121.68, 121.72; 29/827

[56] References Cited

U.S. PATENT DOCUMENTS

| | | | |
|---|---|---|---|
| 4,055,062 | 10/1977 | Martin et al. | 72/700 |
| 4,320,412 | 3/1982 | Hynes et al. | 257/677 |
| 4,458,134 | 7/1984 | Ogle | 219/121.7 |
| 4,551,912 | 11/1985 | Marks et al. | 437/19 |
| 4,894,752 | 1/1990 | Murata et al. | 257/676 |
| 5,105,833 | 4/1992 | Mattei et al. | 131/281 |
| 5,108,785 | 4/1992 | Lincoln et al. | 427/96 |
| 5,168,454 | 12/1992 | LaPlante et al. | 364/474.08 |
| 5,179,965 | 1/1993 | Komori et al. | 131/281 |
| 5,247,883 | 9/1993 | Kuwahara et al. | 101/170 |
| 5,263,250 | 11/1993 | Nishiwaki et al. | 29/890.1 |
| 5,272,312 | 12/1993 | Jurca | 219/121.83 |
| 5,278,385 | 1/1994 | Gerome et al. | 219/121.68 |
| 5,327,045 | 7/1994 | Fox | 313/632 |
| 5,580,466 | 12/1996 | Tada et al. | 216/3 |
| 5,632,083 | 5/1997 | Tada et al. | 219/121.68 |

FOREIGN PATENT DOCUMENTS

| | | | |
|---|---|---|---|
| 60-224254 | 11/1985 | Japan | 29/827 |
| 3-196651 | 8/1991 | Japan | 29/827 |
| 2137805 | 10/1984 | United Kingdom | 219/121.71 |

OTHER PUBLICATIONS

"Laser Drilled Holes in Fired Ceramics", by Fugardi et al., IBM Technical Disclosure Bulletin, vol. 14, No. 10, Mar. 1972, p. 2869.

*Primary Examiner*—Geoffrey S. Evans
*Attorney, Agent, or Firm*—Skjerven, Morrill, MacPherson, Franklin & Fried LLP

[57] ABSTRACT

Lead frames for integrated circuit packaging are partly fabricated using laser machining to form the very small diameter (0.005 to 0.010 diameter) holes in the lead frames which are later used for epoxy adhesive penetration. A high power Nd:YAG laser provides a laser beam which is moved and focused by a control unit onto the surface of a continuous stock strip in order is to drill the epoxy holes at the desired locations. A similar apparatus, but using a copper vapor laser, can trim very fine pitch (0.005 inch) leads for the lead frames. The remaining parts of the lead frames, which involve larger sized elements, are formed conventionally by using stamping or etching. By controlling the laser operating parameters in terms of laser power, pulse duration and pulse frequency and by control of the location of the laser beam by deflecting galvanometers, very precise cutting and drilling can be accomplished, with accuracy down to 0.00005 inch or less. Tooling costs are thereby reduced and in addition new types of lead frames with very closely spaced lead tips can be fabricated that cannot be fabricated using conventional processes.

13 Claims, 5 Drawing Sheets

HOLE GENERATION AND LEAD FORMING FOR INTEGRATED CIRCUIT LEAD FRAMES USING LASER MACHINING

BACKGROUND OF THE INVENTION

1. Field of the Invention

This invention relates to integrated circuit packaging and more specifically to an improved methods and apparatuses for fabricating the lead frames used with integrated circuits and other semiconductor components.

2. Description of the Prior Art

Lead frames are a well known component used for packaging of integrated circuits and other semiconductor components. A lead frame is a metal frame including the leads of a circuit package, for instance a dual in line package, the leads being held in place by sacrificial components of the lead frame before encapsulation of the lead frame and the attached integrated circuit die. Typically the encapsulation is plastic or ceramic. A typical lead frame 10 is shown in FIG. 1. The lead frame 10 is a thin sheet of e.g. copper alloy defining a large number of openings e.g. 12. The portions of the lead frame defined by the openings 12 are the leads 14, the sacrificial cross pieces 18, and a die attach area 20 on which is shown already attached die 22. Small holes 28 (typically 0.005 inch to 0.010 inch in diameter) are for passage therethrough of the epoxy adhesive which bonds the lead frame to the encapsulation.

In the prior art, lead frames are fabricated in a progressive tool or by an etch process. A progressive tool is one having multiple stations in a single die; at each station there is a precision carbide die station and a corresponding punch station. The die/punch combinations remove the unwanted portions of a continuous copper alloy strip which includes a large number of lead frames, one after another, prior to separation. These tools typically operate at hundreds of strokes per minute, forming e.g. 80 epoxy holes per individual lead frame plus all the other features of each lead frame.

A problem arises because the diameter of the epoxy holes are so small. These are called in the machine tool trade "square" or "over square" holes, in that the diameter of each hole is less than or equal to the thickness of the metal stock from which the lead frames are being formed. It is well known in the art that such square holes are problematic due to the problem of breaking and excessive wear of the very small diameter corresponding punches and/or "pulling a slug". Pulling a slug refers to the piece of stock that is punched out by the punch then being withdrawn back through the lead frame and remaining on the punch or die section and damaging subsequent lead frames. Problematically, these very small diameter epoxy hole punches frequently break and thus require frequent reworking; this substantially increases the cost of fabricating the lead frames. The very small epoxy hole punches are the most problematic part of the punches in terms of initial fabrication, breakage, and wear. It is known in the art that it would be very desirable to find another way of forming the epoxy holes, but none is now available.

A separate but related problem with lead frames is forming of the leads and especially the lead tips. These are typically formed by the same punch and die combinations as form the epoxy holes. The present state of the art in forming the leads is a pitch (distance center line-to-center line of adjacent leads) of a minimum of 0.0074 inch for 0.0060 inch lead frame material thickness. Such leads are formed using the above-described precision carbide dies, or by etching utilizing closely controlled chemical etching processes. However, both of these technologies are at their limits and cannot provide smaller pitch lead frame leads. In addition, it has been found that when lead frames are chemically etched to a very small size, the etching process causes under cut or over cut (depending on the orientation). This etching thereby causes a pyramidal cross sectional shape which lessens the strength of the lead, which undesirably causes lead breakage and lower yields.

It would be very desirable to be able to fabricate a finer pitch lead structure, having a pitch e.g. under 0.0074 inch.

Thus both of the above problems require forming very small dimension features in lead frames which are typically planar metal stock. Conventional machining and chemical etching methods have not been found satisfactory for the above-described reasons.

SUMMARY

In accordance with the invention, lead frame epoxy holes and fine pitch leads are formed by laser drilling and/or cutting using a pulsed high energy laser. It has been found by the present inventors that even materials such as copper alloys, the common lead frame material, may have such small diameter epoxy holes drilled in them using a high energy pulsed Nd:YAG laser. For lead cutting, a copper vapor laser has been found to perform best. In each case, the laser beam is focused to a small diameter and is controlled by a galvanometer device or other beam locator such as a precision X-Y table so as to allow high speed drilling and/or cutting of the lead frame.

In accordance with the invention, the entire lead frame need not be machined by the laser beams; instead the gross portions of the lead frame (the larger diameter features) are conventionally formed by the traditional methods of pressing or etching, leaving only the precision features such as the small pitch leads and the epoxy holes to be cut by the laser beam. Thus in accordance with the invention lead frame features are formed utilizing a pulsed high energy laser which has been found suitable for cutting even highly reflective copper. It is well known that copper is difficult to machine using lasers due to its high reflectivity. Hence lasers have generally not been used for machining of copper; however the present inventors have found that at the proper power settings, thin copper stock of the type used for lead frames may be machined using pulsed high energy laser beams. These laser beams are provided from a Nd:YAG laser for hole drilling and from a copper vapor laser for lead trimming (cutting).

Advantageously, use of the laser beams to drill the epoxy holes or other very small features in lead frames eliminates the prior art problems of small hole breakage, die wear and slug pulling, due to the elimination of the epoxy hole punches.

Similarly for definition of the fine pitch leads, a high energy pulsed laser "finishes" pre-cut pre-shaped lead frame leads having for instance a pitch of 0.005 inch or less. By controlling the laser cutting parameters, it has been found that accuracies down to 0.00005 inch or less may be achieved with conventional copper alloy or stainless steel lead frame stock. Also this same amount of control can be used to create square edges (instead of the pyramid shape as provided by the prior art etching process), and thus the leads are narrower yet stronger than in the prior art.

An apparatus for the above-described hole drilling process includes a Nd:YAG laser (which includes a laser head, optics, electronics, and power supply) and a fixture that guides the lead frame stock past the laser head. The lead frame stock, which is a long strip, is fed into position to be drilled by the laser beam which is focused and controlled by a conventional galvanometer-operated laser beam control apparatus. Also in accordance with the invention and in addition to the laser hole drilling, one or more cleaning or deburring stations may be used to remove any deposited material which has been vaporized by the laser drilling process and redeposited around the drilled hole. This deburring is accomplished for instance by grinding or cutting wheels.

A similar apparatus is used for lead trimming, except that a copper vapor laser is used. Also, here the cleaning or deburring stations are not needed because little or no material is deposited. Note that while the hole drilling is an intermediate step to process a standard lead frame, the present lead trimming process is a key step in a process that fabricates lead frames having smaller dimension features than are available in the prior art.

Typically both of these apparatuses are used in conjunction with a conventional progressive press which stamps out the other portions of the lead frame, i.e. the larger diameter features. However in accordance with one embodiment of the invention, the entire lead frame is formed by laser drilling cutting.

DETAILED DESCRIPTION OF THE PREFERRED EMBODIMENTS

Figure 1:
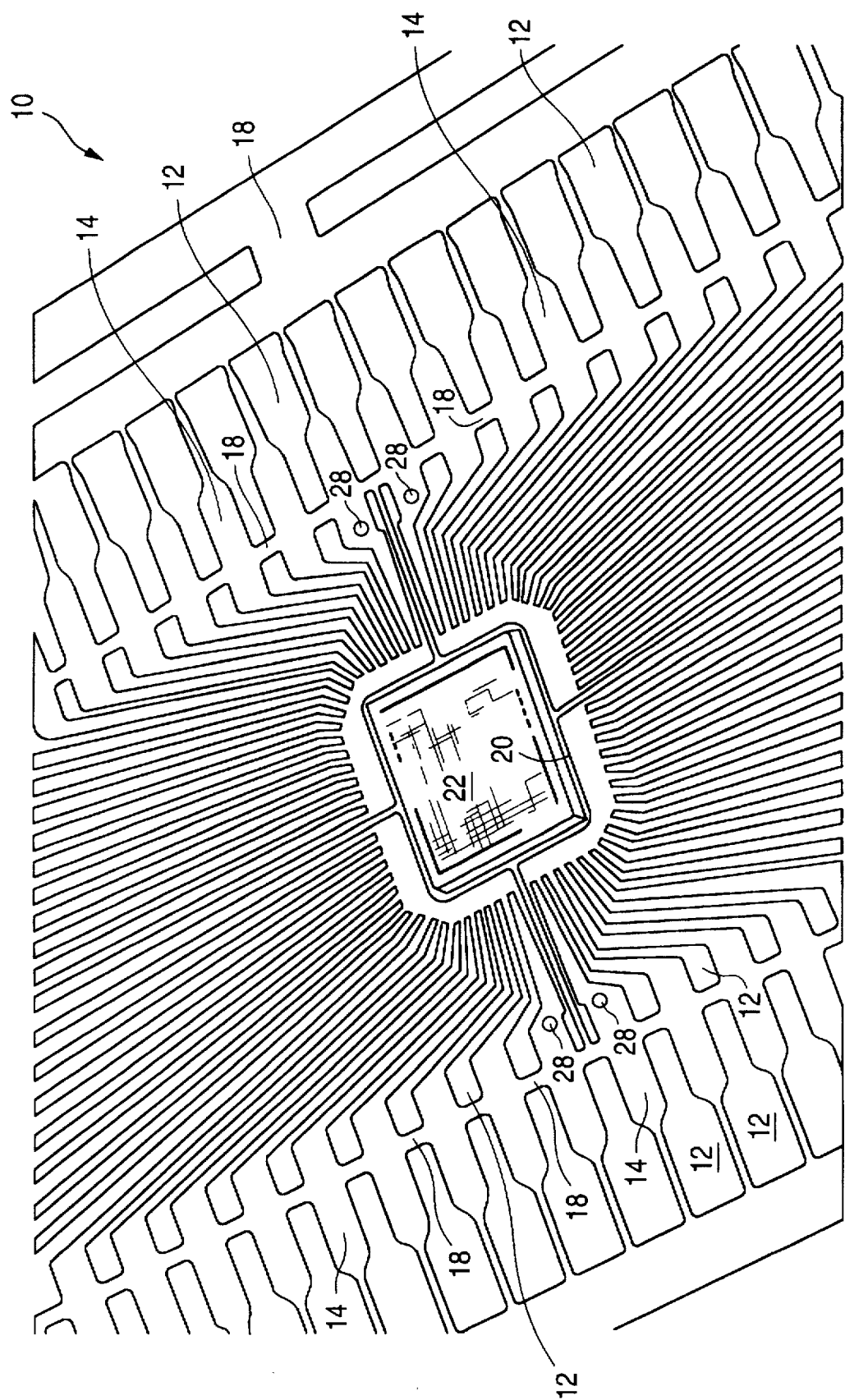
FIG. 1 shows a plan view of a conventional lead frame.
Figure 2:
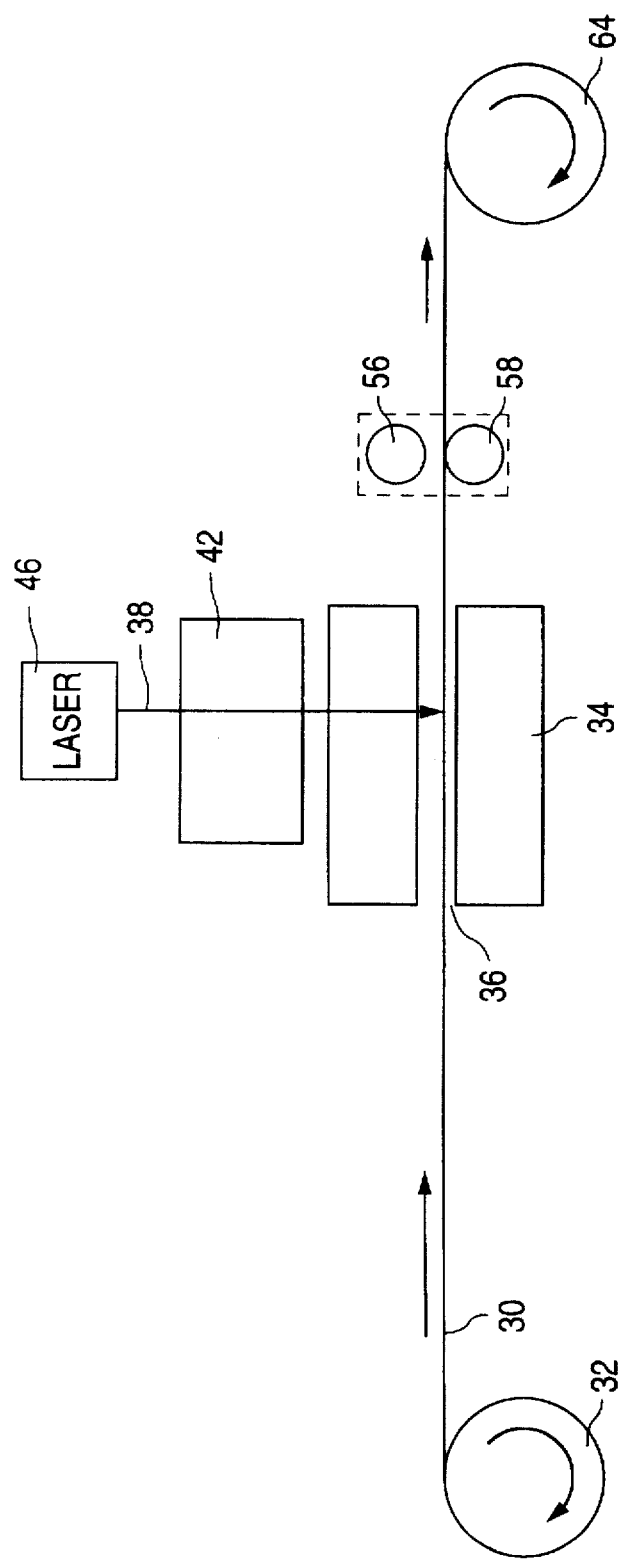
FIG. 2 shows in diagrammatic fashion an apparatus for laser machining features in a lead frame in accordance with the present invention.

FIG. 2 shows diagrammatically an apparatus for fabricating lead frames in accordance with the invention. It is to be understood that this is not a literal representation but includes a number of conventional elements which are shown in block or simplified form, and not all the mechanical features (which as described below are conventional) are depicted. While such conventional features are not depicted for purposes of simplicity, it will be understood by one of ordinary skill in the machine design art that such are necessary and where they are to be provided.

A feed roller 32 has wrapped around it a long strip of lead frame stock 30 of any desired suitable length. This stock typically has already been partially machined by a conventional progressive die and most of the lead frame features have already been stamped out, with the exception for instance of the fine leads and the epoxy holes. The progressive press is not shown since it does not form part of the inventive process. The lead frame stock 30 is a conventionally long strip of lead frames attached end-to-end which is fed from the feed roller 32 into a fixture 34.

Details of fixture 34 are described below; its main feature is a stock channel 36 through which the stock strip 30 is fed. Stock channel 36 is dimensioned as described below to maintain a particular desired tolerance of planarity (in the up and down direction) so that a laser beam 38 may impinge on the upper surface of stock 30, and by application of properly timed laser pulses of adequate energy, cut through stock 30 and hence define the various fine leads and the various epoxy holes. Laser beam 38 is moved in the X and Y directions in the plane of stock strip 30 to locations where the various lead holes and lead cavities are to be cut. The laser beam 38 is emitted from laser 46 and is controlled, directed and focused by laser beam locator 42.

For the hole drilling apparatus, laser 46 is e.g. an Nd:YAG laser model number JK704 sold by Lumonics Corp. of Livonia, Mich. Other lasers may be used; this particular model is only illustrative. The laser beam locator 42 is e.g. of the type supplied by General Scanning Inc. of Watertown, Mass. and is for instance their HPM high performance laser scanner module. This particular device is intended for use with a variety of lasers for performing high volume or custom vector plotting operations. Computer software for user interfacing with the HPM is also provided by General Scanning for control of the laser machining process by means of a computer program via a personal computer. Further details of this conventional control function are not provided herein, except that it is to be understood that the system includes a database which indicates the exact location of any laser drilled holes (or laser removed portions of the lead frame) expressed in XY plane terms relative to reference points on the individual lead frames.

The HPM includes as its key elements two galvanometers, each of which is a limited rotation magnetic torque motor with position feedback which rotates a mirror to reflect and direct the laser beam to particular points. The HPM also includes a field flattening lens which is designed for specific laser beam wavelengths to focus the laser beam to a small desired diameter spot and to maintain this spot size over the entire target field. Also included in the HPM is an embedded microprocessor vector controller that generates and calculates vector lists to pass onto an XY module in the HPM. The XY module includes the basic scanning configuration including two galvanometers, the associated mirrors, drive electronics, a serial computer interface and the appropriate field flattening lens. Also provided is software to optimize vector lists and control the galvanometer movement, and the user interface software.

The HPM XY module thus includes two galvanometers, one designated X and a second designated Y, each driving a mirror to direct the laser beam in respectively the X and Y directions relative to the surface of the lead frame stock 30. This HPM is conventionally integrated with a variety of commercially available lasers and an appropriate power supply for the HPM. For further detail see the General Scanning product literature. However it is to be understood that a variety of laser beam locating devices may be used in accordance with the present invention, and the HPM is only illustrative.

Alternatively, the work piece is moved by a precision X-Y table instead of such a galvanometer-based system.

After the lead frame stock strip 30 is laser drilled and/or cut inside the fixture 34, it emerges from the fixture 34. It is to be understood that actual movement of the stock strip 30 may be continuous or may be in a series of steps, depending on the processing speed and the amount of laser machining to be undertaken.

The stock strip 30 after emerging from the fixture is then (optionally) subject to a deburring operation by for instance a carbide or diamond wheel or cutter 56 which bears up against the upper surface of stock strip 30 to remove any metal which has been vaporized by the laser beam 38 and which was redeposited on the surface of stock strip 30. The stock strip 30 is supported by a support wheel 58 during the deburring process, or the wheel 58 may be a second cutting wheel for deburring the other side of stock strip 30.

There is in existence and well known in the art a burr specification for lead frames which specifies that burrs (conventionally formed by prior art punches) may extend a maximum of 0.002 inch from the surface of the lead frame stock. However most punch presses provide a considerably smaller height burr. In accordance with the invention, the deburring station removes the burr as formed by the laser drilling. However in other embodiments of the invention this redeposited metal burr maybe left in place as being within the deburring specification. It is believed that in accordance with the invention the presence of this metal burr (build up) around the edge of the laser drilled hole is desirable, as described in detail below.

After the deburring station, the stock strip 30 is taken up by a take-up roller 64. The stock is then used conventionally, i.e. severed into individual lead frames and used for the actual assembly of an integrated circuit.

The apparatus in accordance with the invention as shown in FIG. 2 is simplified. Also provided (not shown) is a conventional loop of slack in the stock strip 30 located between the supply roller 32 and the fixture 34, and a second loop of slack in the stock strip 30 between the fixture 34 and the deburring station. Also provided are conventional pinch rollers to act as drivers for stock strip 30, located as needed to pull the stock strip 30 through fixture 34. The stock strip 30 is preferably pulled through fixture 34 rather than being pushed through. Also guide rollers are provided as needed. The control elements for laser beam locator 42 are conventional and include a personal computer with a suitable card as provided by General Scanning (or other suppliers) to drive the laser beam locator 42 in accordance with the desired location of laser drill holes and/or lead frame lead machining.

Figure 3:
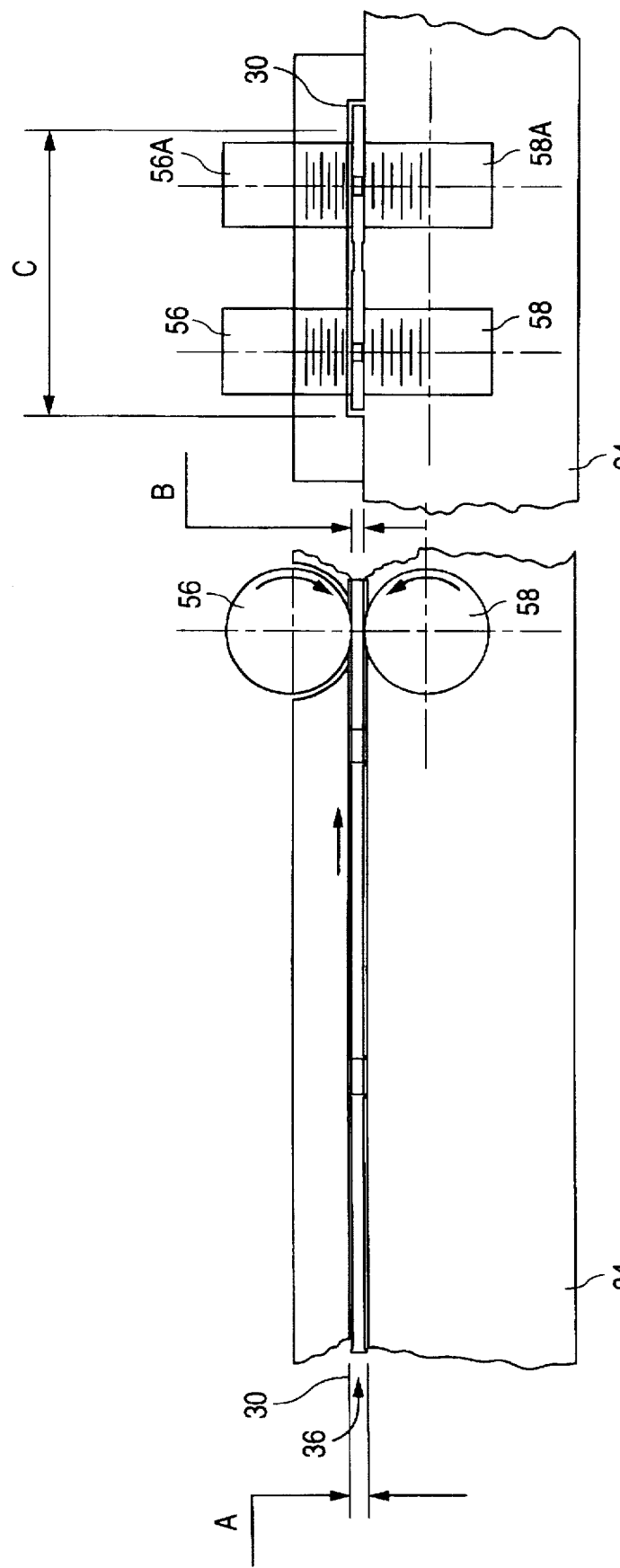
FIG. 3A shows a first view of a fixture in accordance with the present invention.
FIG. 3B shows a second view of the same fixture.

FIG. 3A shows a detailed side cross-sectional view of the fixture 34 showing the stock channel 36. In one embodiment the height A of channel 36 is the actual stock strip thickness plus the height of a typical top side burr plus the height of a typical bottom side burr, plus a tolerance of 0.002 to 0.005 inch.

As shown at the right hand side of the fixture 34 in this embodiment there is an integral deburring station including the two opposing (or offset) cutting wheels 56, 58. These are carbide cutting wheels running concentric within 0.0001 inch TIR at high speed. Dimension B is the height of the channel 36 at the center line of the opposing cutting wheels 56, 58. Dimension B is the actual stock strip 30 thickness plus a tolerance of 0.0002 to 0.0004 inch. The width of the stock channel 36 is shown in the end cross-sectional view of fixture 34 in FIG. 3B as dimension C; dimension C is the actual width of the stock strip 30 plus a tolerance of 0.0005 inch. In this view two sets 56, 58 and 56A, 58A of two opposing cutting wheels are shown; note that typically the epoxy holes are not located in the central portion of the lead frame stock 30 but are towards the outer edges, and hence the cutting wheels 56, 58, 56A, 58A are relatively narrow in this embodiment.

It is to be understood that other embodiments are in accordance with the invention; for instance there is no requirement that the deburring station be integrated with the fixture 34. Also it may be possible to use a single cutting wheel if it is desired only to deburr on one surface of the lead frame stock strip, and a single wide cutting wheel may be used rather than two separated cutting wheels on each side of the stock strip. In other words, the depicted fixture is illustrative of one approach rather than being limiting in either dimensions or configuration. Also, as discussed below the deburring operation may be omitted entirely.

A similar apparatus (not drawn) is used for lead trimming in accordance with the invention. The differences are that for lead trimming, the laser is a copper vapor type laser of the type commercially available. Copper vapor lasers operate at a different wavelength and at different power levels than do Nd:YAG lasers. A copper vapor laser will not leave the burr (redeposited metal), hence no deburring station is needed.

Often the lead frame stock strip conventionally includes a set of pilot holes along either edge. If present, such pilot holes may be used to feed the stock strip 30, but this is not a requirement. In addition, the actual number of stations required in the laser fixture will vary from stock strip to stock strip, based upon the actual number of holes to be drilled and/or the number of leads to be laser cut. It may be possible to use only a single laser station or several may be required.

The laser machining of a stock strip may be performed immediately after the punch press processing of the laser strip or this may be a separate process after the punch pressing is completed, or it may even be before punch pressing.

In one embodiment of the invention, actually drilling a single laser hole takes approximately 1 millisecond; thus 1,000 holes per second may be drilled, not counting any movement of the laser beam between holes. In a more realistic situation, a typical time to drill each hole (including positioning of the laser beam) is 5 milliseconds i.e. approximately 12,000 holes per minute. Cutting the lead frame leads however would take more time because the cutting is more extensive and here the processing speed would be dependent on the actual linear length of the leads to be cut.

In accordance with the invention, the laser drilling/cutting parameters are optimized. This is intended both to speed laser cutting and also to minimize any residual effect of a slag buildup (burrs) from vaporized and redeposited metal around the areas of the drilled holes. This is partly dependent upon how much of a buildup may be tolerated, which is dependent upon the burr specification and other processing parameters.

A typical set of laser operating parameters for laser hole drilling (not lead cutting) is, for a typical stock strip of copper alloy (Olin alloys 151, 194, and 195) having a thickness in the range of 0.005 to 0.010 inch, a laser energy of 400 watts maximum mean power, a laser beam diameter at the surface of the stock strip of 0.005 to 0.007 inch, a pulse length of 0.7 milliseconds and a pulse frequency equal to the number of holes to be drilled per unit of time.

For the case of cutting of the lead frame leads, typical operating parameters are such as to achieve a cutting rate of e.g. 10 to 20 inches per minute. The copper vapor laser power and pulse requirements are dependent on the particular laser.

It has been found by the present inventors that the key parameter is the delivery of energy per second per unit area, in conjunction with the amount of the energy absorbed which is a result of the reflectivity of the surface of the stock strip. Hence to the extent to which the surface of the stock strip is made less reflective due to alloy changes and/or surface finish, the cutting or drilling will be more efficient.

Also in another embodiment of the invention, a gas stream is provided to assist the laser hole drilling and/or cutting.

This "gas assist" involves providing a jet of pressurized gas in the immediate vicinity of the surface of the stock strip where it is being drilled during the drilling, in order to blow away the metal vapor so that it does not redeposit on the surface adjacent to a hole or cut area. This gas stream may be used in conjunction with a vacuum to suck away the gas and the metal vapor. The gas assist may be e.g. an air stream.

Figure 4:
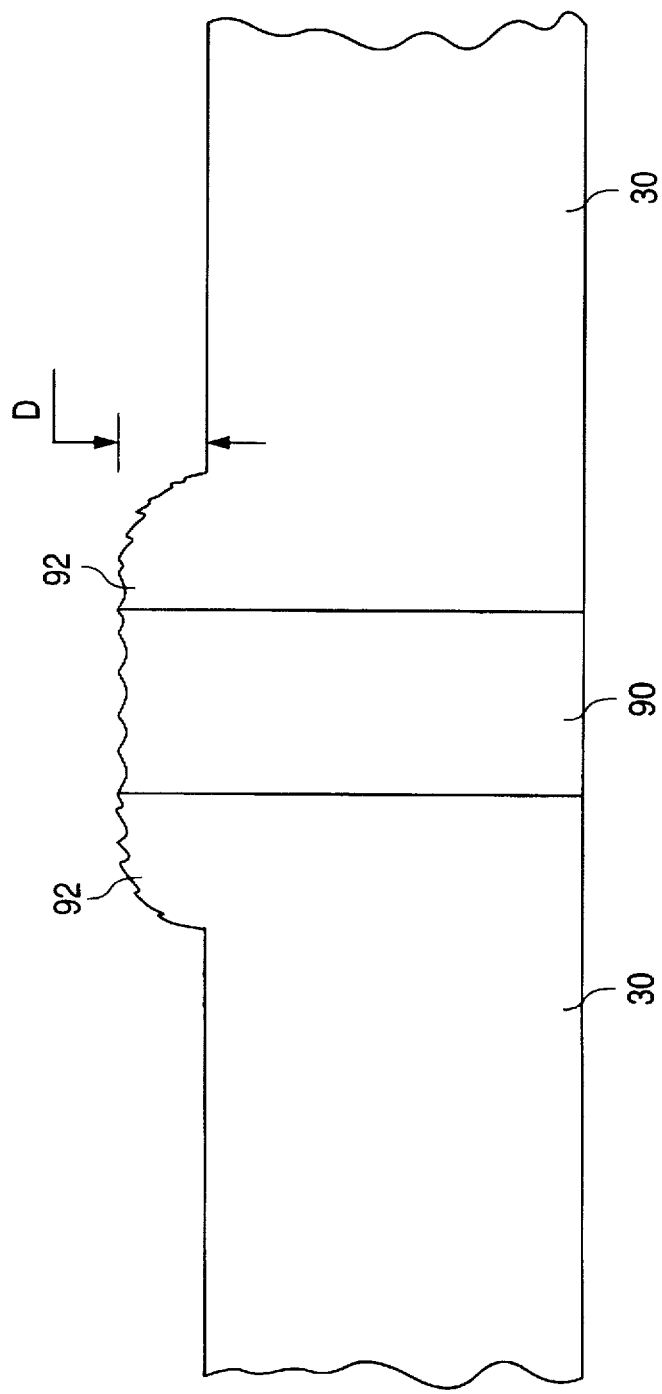
FIG. 4 shows a cross section of an epoxy hole drilled in a lead frame in accordance with the present invention, showing deposited metal around the hole perimeter.

FIG. 4 shows a cross section of a laser drilled hole 90 in stock strip 30 in accordance with the present invention. This drawing is not to scale (similar to the other drawings herein) and does not pertain to the lead cutting embodiment.

The key element depicted here is the buildup 92 of the earlier vaporized and now redeposited metal 92 around the perimeter of hole 90. The depiction here is intended to show the "burr" buildup 92 on at least one side of the stock strip 30. By use of laser operating parameters as disclosed above, the height of the buildup 92 is limited to under 0.002 inch extending from the surface of the stock strip 30. In this case the above-described deburring station was not used and hence the vaporized metal buildup 92 is present in the finished lead frame as shown in FIG. 4.

It has been determined by the present inventors that, at least in some situations, this buildup 92 is desirable and useful because it provides an additional surface area which the epoxy adhesive which penetrates through the hole 90 may key onto, i.e. maintain a better grip than onto the otherwise flat and smooth stock strip 30 surface. Hence a better epoxy bond is achieved than with a smooth stock strip 30 surface.

In this case the lead frame with this buildup 92 around the epoxy holes 90 is an improved lead frame, i.e. an article of manufacture, compared to prior art lead frames not having such buildup 92.

As discussed above, setting the laser parameters for both hole drilling and lead trimming is dependent upon the reflectivity of the laser stock strip 30 material and can be achieved by a limited amount of experimentation of a type well within the skill of one of ordinary skill in the art. A height of the buildup 92 is 0.001 inch with typical lead frame copper alloy material.

Thus use of laser machining in accordance with the present invention for formation of epoxy holes in lead frames advantageously eliminates the slugs and also reduces tooling costs by eliminating the epoxy hole punches from the tooling. It is also to be understood that conventional lead frame tooling, as in the prior art, may be modified in accordance with the present invention for use with laser hole drilling merely by eliminating the epoxy hole punches from the punch, while still using a conventional type die even with the corresponding epoxy holes still in the die, since these will not be used.

By use of the above-described lead trimming apparatus in accordance with the present invention and with a modified control laser program, instead of drilling holes one instead cuts very fine pitch lead frame leads. This advantageously eliminates the more delicate portions of the die conventionally used to form such leads, and hence further reduces tooling cost and more importantly also allows formation of very small pitch leads which is not possible with conventional punch/die sets due to tooling limitations.

Figure 5:
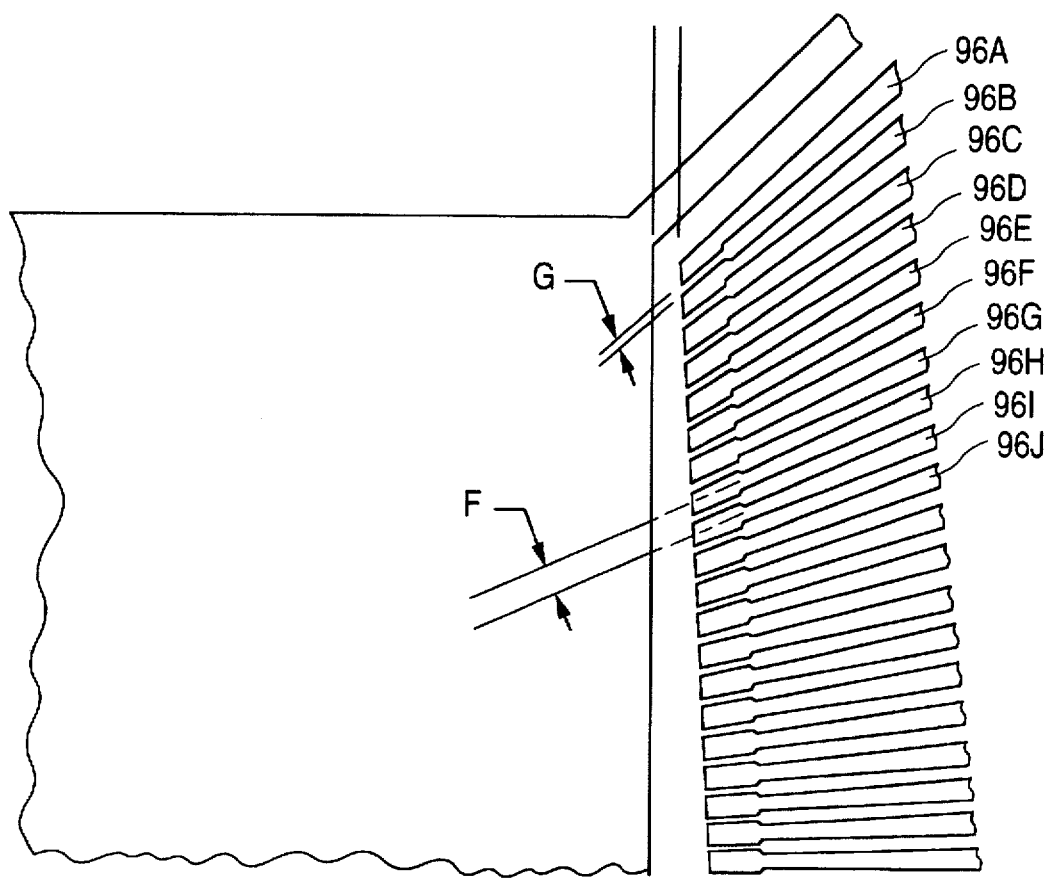
FIG. 5 shows lead frame leads formed by laser cutting.

FIG. 5 shows a portion of a lead frame illustrating laser cutting to "finish" a pre-cut pre-shaped lead frame. The leads 96A, 96B, 96C, . . . have been already stamped or etched, having a pitch F of e.g. 0.005 inch center-line to center-line. However, at the lead tips the stamping or etching cannot achieve the fine cuts needed between adjacent tips. Hence a laser beam makes a cut of G width e.g. 0.001 to 0.002 inch, between adjacent lead tips providing a pitch between lead tips (center line to center line) of 0.006 inch or less.

This disclosure is illustrative and not limiting; further modifications will be apparent to one skilled in the art and are intended to fall within the scope of the appended claims.

We claim:

1. A method of fabricating a portion of a lead frame for an integrated circuit, comprising the steps of:

feeding a length of flat copper alloy stock; and applying a narrow diameter beam from a copper vapor laser to a surface of the fed stock, thereby removing a portion through-and-through the stock.

2. The method of claim 1, wherein the step of feeding comprises pulling the stock.

3. The method of claim 1, further comprising the step of providing a stream of gas past the surface of the stock, thereby removing vaporized metal.

4. The method of claim 1, wherein the stock is fed from a roll of the stock.

5. The method of claim 1, further comprising the step of removing portions of the stock by pressing the stock in a punch and die combination.

6. The method of claim 1, wherein the removed portion defines a remaining portion that is a lead of the lead frame.

7. The method of claim 6, wherein the lead has a pitch of less than 0.007" to an adjacent lead.

8. An apparatus for removing through-and-through portions of flat copper alloy stock, comprising:

a feeder for feeding a length of the copper alloy stock;

a fixture for holding the fed length of stock in a predetermined position;

a copper vapor laser held in a fixed position relative to the fixture; and a laser beam positioner held in a fixed portion relative to the laser and adapted for focusing a laser beam from the laser on selected locations on a surface of the copper alloy stock in the fixture.

9. The apparatus of claim 8, wherein the feeder includes a supply roller and a take up roller.

10. The apparatus of claim 9, further comprising means for pulling the stock from the supply roller through the fixture.

11. The apparatus of claim 8, wherein the laser beam positioned includes a reflective surface rotated by a galvanometer drive.

12. The apparatus of claim 8, further comprising a source of gas located adjacent the fixture, thereby to blow vaporized metal away from the stock.

13. The apparatus of claim 8, wherein the fixture defines a stock channel having a width and height each greater than that of the stock by a respective predetermined tolerance.

* * * * *